United States Patent [19]
Gardner

[11] Patent Number: 5,414,221
[45] Date of Patent: May 9, 1995

[54] EMBEDDED GROUND PLANE AND SHIELDING STRUCTURES USING SIDEWALL INSULATORS IN HIGH FREQUENCY CIRCUITS HAVING VIAS

[75] Inventor: Donald S. Gardner, Mountain View, Calif.

[73] Assignee: Intel Corporation, Santa Clara, Calif.

[21] Appl. No.: 93,266

[22] Filed: Jul. 15, 1993

Related U.S. Application Data

[63] Continuation-in-part of Ser. No. 815,234, Dec. 31, 1991.

[51] Int. Cl.⁶ .............................................. H05K 9/00
[52] U.S. Cl. ................................. 174/261; 174/262; 174/264; 174/265
[58] Field of Search ............ 174/261, 262, 264, 35 R, 174/265; 257/668, 684, 700, 703

[56] References Cited

U.S. PATENT DOCUMENTS

| | | |
|---|---|---|
| 4,023,197 | 5/1977 | Magdo et al. |
| 4,628,406 | 12/1989 | Smith et al. |
| 4,803,450 | 2/1989 | Burgess et al. |
| 4,931,411 | 6/1990 | Tigelaar et al. |
| 5,056,216 | 10/1991 | Madou et al. |
| 5,079,670 | 1/1992 | Tigelaar et al. |
| 5,126,794 | 6/1992 | Altmann |
| 5,139,971 | 8/1992 | Giridhar et al. |
| 5,165,166 | 11/1992 | Carey |
| 5,210,379 | 5/1993 | Okonogi et al. |
| 5,262,596 | 11/1993 | Kawakami et al. |
| 5,308,929 | 5/1994 | Tani et al. |

OTHER PUBLICATIONS

Hartmut Roskos, Martin C. Nuss, Keith W. Goossen, David W. Kisker, Alice E. White, Ken T. Short, Dale C. Jacobson, & John M. Poate, "Propagation of Picosecond Electrical Pulses on a Silicon–Based Microstrip Line With Buried Cobalt Silicide Ground Plane", Appl. Phys. Lett 58(23), 10 Jun. 1991, pp. 2604–2606.

Primary Examiner—Leo P. Picard
Assistant Examiner—Cheryl R. Figlin
Attorney, Agent, or Firm—Blakely, Sokoloff, Taylor & Zafman

[57] ABSTRACT

A process for fabricating embedded ground plane and shielding structures using sidewall insulators in high frequency circuits having vias or contacts. A conductive ground plane disposed between two dielectric layers has vias formed by removing insulating dielectric and conductive ground plane material according to a single photo-lithography masking operation. A sidewall insulator formed on vertical sidewalls of the vias, electrically isolates the ground plane from interconnect metal passing from a lower interconnect layer to an upper interconnect layer through the vias. Alternatively, shielding structures incorporating multiple sidewall insulators and upper and lower shielding may be fabricated to entirely encapsulate the lower interconnect metal from external environments. Process efficiency and yield are increased due to the simplified processing of the embedded ground plane and shielding structures. A variety of deposition methods are set forth including methods employing an anisotropic etch and methods employing an etch-stop/masking layer. Resulting structures are also described.

9 Claims, 11 Drawing Sheets

| 1. | Obtain [starting] substrate with completed underlying circuit processing |
|---|---|
| 2. | P-doped silicon dioxide ($SiO_2$) deposition (3000Å thick) |
| 3. | Deposit 1000 Å of aluminum for the ground plane |
| 4. | P-doped silicon dioxide ($SiO_2$) deposition (3000Å thick) |
| 5. | Photolithography for layers deposited in 2, 3, and 4 |
| 6. | Harden resist |
| 7. | Contact oxide etch |
| 8. | Ground plane metal etch |
| 9. | Contact oxide etch |
| 10. | Plasma and/or wet photoresist removal |
| 11. | Silicon dioxide ($SiO_2$) deposition (3000Å) thick |
| 12. | Anisotropic etching of silicon dioxide ($SiO_2$) |
| 13. | Deposition of interconnect metal |
| 14. | Photolithography of interconnect metal deposited in step 13 |
| 15. | Subsequent insulating dielectric deposition |

Figure 4

| 1. | Obtain [starting] substrate with completed underlying circuit processing |
|---|---|
| 2. | P-doped silicon dioxide ($SiO_2$) deposition (3000Å thick) |
| 3. | Deposit 1000 Å of aluminum for the ground plane |
| 4. | P-doped silicon dioxide ($SiO_2$) deposition (3000Å thick) |
| 5. | Etchstop/Masking layer (SiN) sputter deposition (50 nm thick) |
| 6. | Photolithography for layers deposited in 2,3,4, and 5 |
| 7. | Harden resist |
| 8. | Etch through etchstop layer |
| 9. | Contact oxide etch |
| 10. | Ground plane metal etch |
| 11. | Contact oxide etch |
| 12. | Plasma and/or wet photoresist removal |
| 13. | Silicon dioxide ($SiO_2$) deposition (3000Å) thick |
| 14. | Anisotropic etching of silicon dioxide ($SiO_2$) |
| 15. | Deposition of via or contact metal |
| 16. | Etchback of via or contact metal |
| 17. | Photolithography of interconnect metal deposited in step 15 |
| 18. | Subsequent insulating dielectric deposition |

Figure 6

| 1. | Obtain [starting] substrate with completed underlying circuit processing |
|---|---|
| 2. | P-doped silicon dioxide ($SiO_2$) deposition (3000Å thick) of first dielectric layer |
| 3. | Deposit 1000 Å of aluminum for the ground plane |
| 4. | Photoresist deposit |
| 5. | Photolithography for layers deposited in steps 2 and 3 to form first via in first dielectric layer and ground plane |
| 6. | Harden resist |
| 7. | Ground plane metal etch |
| 8. | Contact oxide etch |
| 9. | Plasma and/or wet photoresist removal |
| 10. | P-doped silicon dioxide ($SiO_2$) deposition (3000Å thick) of second dielectric layer for filling first via and covering ground plane |
| 11. | Photoresist deposit |
| 12. | Photolithography for second dielectric layer to expose vias |
| 13. | Contact/via oxide etch |
| 14. | Plasma and/or wet photoresist removal |
| 15. | Via metal deposition |
| 16. | Via metal etchback |
| 17. | Deposition of interconnect metal |
| 18. | Photolithography and patterning of interconnect metal |
| 19. | Subsequent insulating dielectric deposition |

Figure 8

| | |
|---|---|
| 1. | Obtain [starting] substrate with completed underlying circuit processing |
| 2. | P-doped silicon dioxide ($SiO_2$) deposition (3000Å thick) of first dielectric layer |
| 3. | Deposit 1000 Å of aluminum for the ground plane |
| 4. | Photoresist deposit |
| 5. | Photolithography for layers deposited in steps 2 and 3 to form first via in first dielectric layer and ground plane |
| 6. | Harden resist |
| 7. | Ground plane metal etch |
| 8. | Contact/via oxide etch |
| 9. | Plasma and/or wet photoresist removal |
| 10. | P-doped silicon dioxide ($SiO_2$) deposition (3000Å thick) of second dielectric layer for filling first via and covering ground plane |
| 11. | Photoresist deposit |
| 12. | Photolithography for second dielectric layer to produce second via and for exposing portion of ground plane |
| 13. | Contact or via oxide etch |
| 14. | Plasma and/or wet photoresist removal |
| 15. | Deposition of butting interconnect metal contact with interconnect metal |
| 16. | Photolithography of interconnect metal |
| 17. | Patterning of interconnect metal |
| 18. | Subsequent insulating dielectric deposition |

Figure 10

EMBEDDED GROUND PLANE AND SHIELDING STRUCTURES USING SIDEWALL INSULATORS IN HIGH FREQUENCY CIRCUITS HAVING VIAS

The present application is a continuation-in-part of application Ser. No. 07/815,234, filed on Dec. 31, 1991.

BACKGROUND OF THE INVENTION

1. Field of the Invention

The present invention relates to electronic circuits, and more particularly relates to high speed electronic circuits propagating high frequency signals.

2. Art Background

Electronic circuits, and in particular computer and instrumentation circuits, have in recent years become increasingly powerful and fast. Driven in large part by customer demand, present day computer circuits are many times, and in cases, several orders of magnitude faster than their prior generation counterparts. When circuit frequencies and signal wave forms are sufficiently low, inductive reactance is small and only the resistance and capacitance of wires is significant. Electronic components may be represented as lumped circuit elements. However, as clock frequencies and the associated propagated signals exceed frequencies of many tens of MHz, inductive reactance increases and capacitance reactance decreases. The electrical wires are more sensitive to the surrounding geometry and structure and are modeled using transmission lines. For example, electrical signals operating at high frequencies, including clock and data signals, emit electric fields from their associated data paths which couple to and affect neighboring signals. In fact, interconnections are becoming the limiting factor in how fast electronic circuits may operate, especially in VLSI (Very Large Scale Integration) and ULSI (Ultra Large Scale Integration) circuits.

In order to enhance the speed and performance of high speed electronic circuits, ground planes are used to improve the propagation of signals along electrical pathways. As suggested above in connection with the surrounding geometry of high frequency signal propagation, ground planes are desirable because they help control the impedance presented to a signal propagating along a wire, thereby reducing crosstalk and reflections. Reflections can be caused by variations in surface topography as a signal path traverses over steps, and other physical boundaries, or by impedance discontinuities along the signal path. Ground planes ensure that reflections in signal data paths from variations in geometry are minimized, and that signal line impedance does not vary substantially as the signal path traverses the circuitry. Further, because the high frequency electric field emitting from a given signal path using a ground plane is concentrated between that signal path and the ground plane, crosstalk between the given signal path and an adjacent signal path is commensurably reduced. Ground planes are frequently incorporated into high frequency electronic circuitry because they are effective in reducing crosstalk and reflections in high frequency signal paths. For example, ground planes are common place in electronic circuits operating at RF and microwave frequencies.

Although known in the prior art, fabrication of ground planes in electronic circuits remains cumbersome, requiring two distinct material deposition steps and two distinct patterning operations. In particular, a ground plane metal would typically be deposited upon a previously deposited dielectric layer, whereafter the ground plane metal is patterned and etched. Thereafter, a second dielectric layer is deposited, patterned, and etched in an appropriate fashion to insulate the ground plane metal. In order to make electrical contact with external control and data signals, metallic conductors that are below the ground plane metal must rise up and pass through the ground plane metallization without making physical contact to it. Where such underlying metallic conductors must pass through the ground plane, it is necessary to electrically insulate the conductor metal from the ground plane metal to prevent shorting. Accordingly, the "double deposition" and "double patterning" methods have been exclusively used in the prior art to insulate the metallic conductor passing through the ground plane metal. Patterning operations are complex in that they typically require a photo-lithographic process and etching process. The added complexity will have an effect on the yield of the product and in turn, the cost.

As will be explained in the following detailed description, the present invention discloses a new ground plane and sidewall insulator structure which may be used alone or in combination to produce embedded ground planes or, alternatively, shielded conductor signal paths. Moreover, the present invention provides methods requiring fewer processing operations for producing an embedded ground plane using sidewall insulation for interconnections passing through the ground plane.

SUMMARY OF THE INVENTION

Embedded ground plane and shielding structures using sidewall insulators in high frequency electronic circuits using vias and methods for fabricating same are disclosed. In a first preferred embodiment, a first dielectric layer is deposited over a substrate which may comprise underlying circuitry. The underlying circuitry can include a deposited and patterned first metallic conductor layer. The first dielectric layer is deposited on the substrate, followed immediately by the deposition of a ground plane metal and a second insulating dielectric layer. A photo-resist layer is then applied and patterned to define vertical interconnecting vias or contacts. All constituent layers of the embedded ground plane are etched using the defined photo-resist. After the interconnecting vias have been opened using appropriate etching processes, a third insulating dielectric is deposited and anisotropically etched to produce vertically extending sidewall insulators within the previously opened vias or contacts. A second conductor metal is thereafter deposited, patterned, and etched. The second conductor metal fills the vias and forms an interconnected network of metallic conductor signal and power paths joined by vias extending through and insulated from the embedded ground plane. Conducting paths may be alternatively fabricated in other ways including a "plug" process wherein a conducting material fills a via and then, using a separate deposition step, conducting material for the signal and power paths are patterned and etched.

In a second alternative preferred embodiment, the sidewall insulators may be fabricated multiple times to form shielded signal paths. A first dielectric layer is deposited over a substrate which may comprise underlying circuitry. A first insulating dielectric layer is then deposited, followed immediately by the deposition of a first shielding metal and a second insulating dielectric layer. A photo-resist layer is then applied and patterned to define vertical contact openings. All constituent layers of the first shielding metal structure are etched using the defined photo-resist. After the contact openings have been opened using appropriate etching processes, a third insulating dielectric is deposited and anisotropically etched to produce vertically extending sidewall insulators within the previously opened contact openings. A first metallic conductor layer is thereafter deposited, whereafter a fourth insulating dielectric layer is immediately deposited. A second photoresist layer is then applied and patterned to define first layer interconnect traces together with this fourth dielectric layer. Thereafter, a fifth insulating dielectric layer is deposited and subsequently anisotropically etched to produce a second set of vertically extending sidewall insulators adjacent to the lateral edges of the first interconnect metal traces. A second shielding metal layer is next deposited followed immediately by a sixth insulating dielectric layer deposited above the second shielding metal. A third photo-resist layer is applied and patterned to define vertically interconnecting vias. All constituent layers of the second shielding metal structure are etched using the third photo-resist layer. After the interconnecting vias have been opened using appropriate etching processes, a seventh insulating dielectric layer is deposited and thereafter anisotropically etched to produce a third set of vertically extending sidewall insulators, located within the previously opened vias. A second metallic conductor layer is thereafter deposited, patterned, and etched, filling the vias and forming an interconnected network of first and second metallic conductor signals and power paths joined by vias extending through the shielding structure, surrounding the first metallic conductor traces. The first, second, and third sets of sidewall insulators permit shielding structures to completely surround conducting traces, thereby encapsulating signal traces from harmful environments.

In a third preferred embodiment, the sidewall insulators are fabricated using an intermediate etch-stop/-masking layer which facilitates the formation of an opening in which the sidewall insulators are formed and facilitates an anisotropic etching of the sidewall insulator to prevent degradation of the edges of the opening. As with the embodiments described above, a first silicon dioxide layer, a ground plane layer, and a second silicon dioxide layer are deposited in succession on a substrate. The substrate is a preexisting structure which may include electrical circuits and contacts. Next, an etch-stop/masking layer, which may comprise sputtered aluminum or silicon, is deposited upon the second silicon dioxide dielectric layer. A photoresist layer is deposited on the etch-stop/masking layer and photo-lithography steps are performed to etch an opening through each of the four deposited layers, thereby exposing the substrate. The etch-stop/masking layer facilitates the etch of the opening to ensure that sidewalls of the opening are substantially vertical. Once the opening is formed a third layer is deposited onto the top of the etch-stop/masking layer and into the via thereby coating the sidewalls of the via. The third layer may be, for example, silicon dioxide. The third layer has a first portion covering the etch-stop/masking layer, a second portion covering sidewalls of the opening, and a third portion covering the substrate forming the bottom of the opening. The first and the third portions of the third layer are removed using an anisotropic etch, thereby leaving the second portion adhering to the sidewalls of the opening. The second portion forms a sidewall insulator. The etch-stop/masking layer can then be removed, although it could also be left if it is an insulator. If a connection is then made between upper and lower metal contacts through the opening, the sidewall insulator isolates the ground plane from the metal in the opening.

In a fourth preferred embodiment, a sidewall insulator is formed without requiring either an anisotropic etch or an etch-stop/masking layer. In the fourth preferred embodiment, a first silicon dioxide dielectric and a electrically conducting ground plane layer are deposited, in succession, on a substrate. The substrate is a preexisting structure which may include electrical circuits and contacts. A photo-resist is deposited onto the ground plane layer and photo-lithography steps are performed to form a first opening within the ground plane. The first opening extends downwardly through the first silicon dioxide layer to the substrate, thereby exposing a portion of the substrate. Next, a second silicon dioxide layer is deposited onto the ground plane and into the first opening, filling the opening. The second silicon dioxide dielectric has a first portion covering the ground plane and a second portion covering the underlying substrate or underlying metal level within the first opening. The second portion also covers sidewalls of the first opening. Next a second photo-resist layer is deposited onto the second dielectric and photolithography steps are performed to etch one or more secondary openings through the second portion of the second dielectric. The secondary openings are each offset from the sidewalls of the ground plane and the first dielectric, thereby leaving a portion of the second dielectric covering the ground plane but exposing portions of the underlying substrate. Metal plugs may be formed within the secondary openings to provide an electrical connection to the substrate. The portions of the second dielectric, which cover the side edges of the ground plane, isolate the ground plane from the metal contacts. Hence, with the fourth preferred embodiment, a ground plane is isolated within an integrated circuit structure from metal contacts without requiring two additional masking steps and the use of an anisotropic etch of a third dielectric layer. Instead, only one additional masking step is needed. The second dielectric layer covers both a top portion of the ground plane and side edges of the ground plane. In the fourth preferred embodiment, additional openings may be etched directly through the second dielectric to the ground plane for exposing the ground plane simultaneously with the etch of the second dielectric for creating the secondary openings to the underlying substrate. The additional openings allow direct electrical connect to the ground plane to facilitate grounding of the ground plane.

In a fifth preferred embodiment, a sidewall insulator is formed on only one side of an opening containing a metal contact, whereby the metal plug abuts the ground plane providing an electrical connection from the underlying substrate to the ground plane. To form the fifth embodiment, a first silicon dioxide dielectric and a ground plane are deposited, in succession, on a substrate. The ground plane and first dielectric layer are patterned and etched in accordance with photo-lithography steps to form a first opening exposing the substrate. Then, a second silicon dioxide dielectric layer is deposited onto the ground plane and into the first opening. The second dielectric is patterned and etched to provide a secondary opening exposing portions of the underlying substrate within the confines of the first opening. However, unlike the preceding embodiment wherein the secondary opening is completely offset from sidewalls of the first opening to thereby completely isolate the ground plane, at least some of the secondary opening of this embodiment is formed immediately adjacent to and exposing a portion of the surrounding ground plane. A metal butting contact is formed within such secondary opening, which electrically connects portions of the underlying substrate to the ground plane.

In a further embodiment of the present invention, the ground plane of the present invention is fabricated in selective areas of the substrate or near selected individual interconnections.

Thus, the third, fourth and fifth embodiments of the invention provide alternative deposition methods and resulting structures for use in isolating ground planes. The third embodiment provides a method for forming a sidewall insulator using an etch-stop/masking layer. The fourth embodiment provides a method for forming a sidewall insulator using one rather than two masking steps and without requiring an anisotropic etch. The fifth embodiment provides a method for connecting the ground plane to the underlying substrate or metal level with the one additional masking step in the fourth embodiment that does not require an anisotropic etch. Specific structures which may be formed using the methods of the fourth and fifth embodiments also form a portion of the invention.

Hence, a variety of integrated circuit structures having insulated ground-planes are provided, along with methods for forming the structures.

BRIEF DESCRIPTION OF THE DRAWINGS

The present invention will be understood more fully from the detailed description given below and from the accompanying drawings of the preferred embodiment of the invention in which:

FIG. 4 is an exemplary process flow-chart specifying the operations to produce the embedded ground plane with vias having sidewall insulators.

FIG. 6 is an exemplary process flow-chart illustrating the operations to produce the embedded ground plane structure of FIGS. 5A–5H.

FIG. 8 is an exemplary process flow chart illustrating the operations to produce the embedded ground plane of FIGS. 7A–7F.

FIG. 10 is an exemplary process flow specifying the operations to produce the embedded ground plane of FIGS. 9A–9E.

DETAILED DESCRIPTION OF THE INVENTION

An embedded ground plane with insulated vias and methods for fabricating the same are disclosed. In the following detailed specification, numerous specific details are set fourth, such as thicknesses, materials, etc., in order to provide a thorough understanding of the present invention. It will, however, be obvious to one skilled in the art that the present invention may be practiced without specific details. In other instances, well known processing steps and well known device structures have not been described in detail in order not to unnecessarily obscure the present invention. The reader will further note that the present invention may be embodied within microelectronic circuits (microchips), large multi-chip modules (MCM), or other circuits boards/structures that require ground planes and use vias.

Figure 1A:
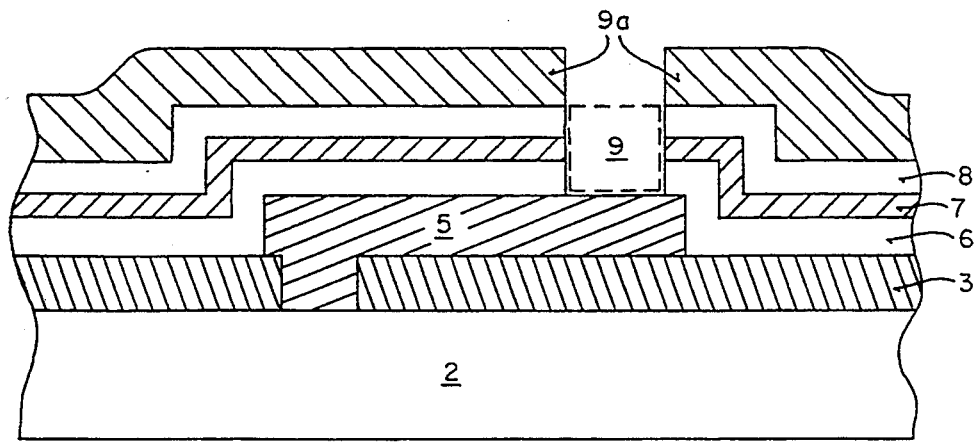
FIG. 1A illustrates a cross-sectional view of the fabrication of an embedded ground plane with insulating sidewalls, wherein a photo-resist layer is used to define the multiple layers forming the embedded ground plane.

Referring now to FIG. 1A, a cross-sectional illustration of the preferred embodiment of the present invention is shown. In FIG. 1A, an embedded ground plane structure is formed upon a substrate 2, wherein for purposes of the present detailed description it is understood that substrate 2 integrally contains electronic circuitry elements and pathways. After processing of the base layer non-metallic circuitry is complete, an insulating dielectric 3 is deposited followed by a first interconnect metal layer 5. The thicknesses of dielectric layer 3 and interconnect metal layer 5 may be produced in any appropriate thickness for the specific application intended, and will not limit application of the present invention. As previously stated, it is intended that the present invention function equally well with microchip components as well as larger MCMs or printed circuit board applications. Following deposition of the first interconnect metal layer 5, it is patterned and etched to produce a multiplicity of interconnecting Metal 1 lines.

After the Metal 1 lines have been formed, a lower ground plane insulating dielectric layer 6 is deposited. Significantly, the present invention provides that the ground plane and the associated insulating dielectric layers are "self-aligned". That is, all layers forming the encapsulated ground plane will be deposited prior to any photo-lithographic definition of the ground plane.

Accordingly, following deposition of the lower insulating dielectric layer 6, a suitable ground plane metal layer 7 and an upper insulating dielectric layer 8 are immediately deposited, without intervening photo-lithography and etching operations. In the presently preferred embodiment of the present invention, lower and upper insulating dielectric layers 6 and 8 are doped silicon dioxide ($SiO_2$), each of the layers being approximately 3000 angstroms thick. Unlike ground planes fabricated according to prior art methods, the present invention takes full advantage of the triple layer "sandwich" 15 formed by layers 6, 7, and 8 by providing that the constituent layers of sandwich 15 all be etched using a single photo-lithographic mask layer (not yet deposited). The foregoing is significant in that two photo-lithography steps are saved in the process, wherein each photo-lithography step actually entails multiple sub-steps. Processing cost and cycle time are accordingly reduced together with fabrication yield loss associated with photo-lithography.

With further reference to FIG. 1A, a photo-resist layer 9a is next applied and defined where a via 9 will be formed. In the art, openings which expose silicon contact regions such as sources and drains in MOS devices, and collectors, bases, and emitters in bipolar devices are generally referred to as "contact openings," while openings which expose other structures such as an underlying metal layer are generally referred to as "vias." In describing the structures herein, any of the terms "via," "contact opening," or simply "opening" may be used to describe a particular opening to indicate that it may be of the type referred to. However, it will be understood that the described opening could be a via or a contact opening depending upon the underlying layer which is exposed for subsequent contacting, and use of a particular term in the detailed description is not meant to limit the structure to the more restrictive definition of that term described above. As seen in FIG. 1A, photo-resist layer 9a permits subsequent consecutive etch processes to sequentially remove the deposited oxide, metal, and oxide layers 6, 7, and 8 where not masked by photo-resist 9a. As presently preferred, three separate etch processes are used to etch, in order, layers 8, 7, and 6. However, it is anticipated that in certain circumstances all three layers could be etched with a suitable single etch process, or alternatively, three etch processes performed within in a single etch or process module. One skilled in the art will appreciate that etching of the aforesaid layers 6, 7, and 8 may be accomplished in the appropriate fashion for the particular materials used for such layers, and the layers are not limited to the $SiO_2$ and aluminum materials specified in the preferred embodiment.

Figure 1B:
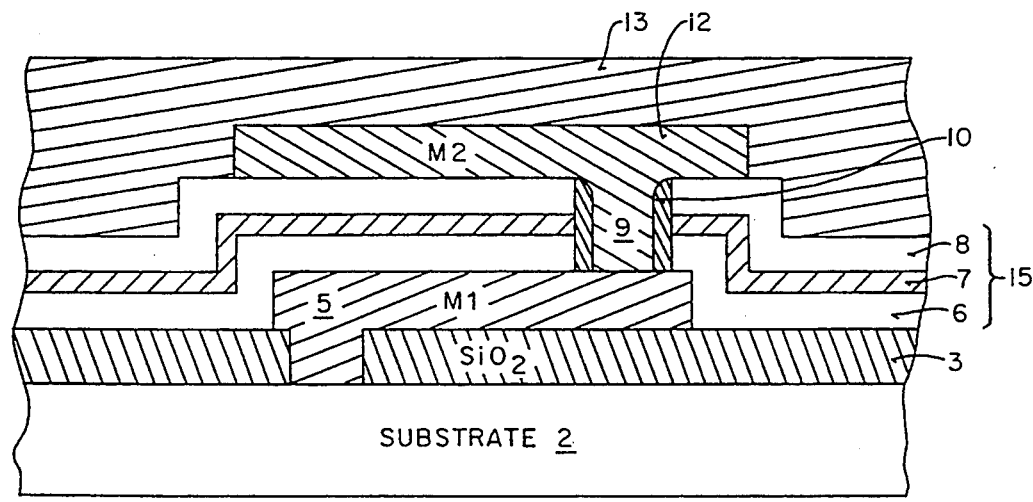
FIG. 1B illustrates a cross-sectional view of an embedded ground plane having sidewall insulators as provided by the present invention.

Reference is now made to FIG. 1B. Following the formation of via 9 by etching lower and upper dielectric layers 6 and 8 and the ground plane metal 7, the photo-resist layer 9a is removed in a photo-resist strip operation that can include plasma dry stripping and/or an appropriate wet strip. Thereafter, a suitable low temperature oxide (LTO) insulating dielectric layer 10 is deposited, and in the preferred embodiment consists of 3,000 angstroms of silicon dioxide. The dielectric layer 10 will form vertically extending sidewall insulators for the embedded ground plane. The silicon dioxide forming layer 10 contains both phosphorus and boron trace impurities for purposes more definitively explained below. Following deposition of dielectric layer 10, an anisotropic sidewall etch process is performed over the entire surface of substrate 2, the etch being, in effect, a "blanket" etch. Intervening photo-lithography steps and processing are therefore unnecessary. The trace phosphorous and boron concentrations increase the etch rate of silicon dioxide forming dielectric layer 10, and ensure that dielectric layer 10 is removed from all horizontal surfaces, particularly the bottom of via 9. As above, the anisotropic sidewall etch may be optimized for any particular materials used and etch profile desired, and will not be discussed in detail. However, it is important to note that the sidewall etch process must be sufficiently anisotropic in order to retain the vertically oriented portions of dielectric layer 10 necessary to isolate the ground plane 7 from a second interconnect metal to be deposited, while simultaneously removing the sidewall insulator dielectric from the Metal 1 (formed of first interconnect metal layer 5) at the bottom of via 9. Accordingly, dielectric layer 10 will henceforth be referred to as sidewall insulator 10. Again, one skilled in the art will note that layer 10, as well as layers 6 and 8, are not limited to $SiO_2$ material, and that other insulating material combinations such as silicon nitride ($Si_3N_4$) and silicon oxynitride ($SiO_xN_y$) are possible.

Following formation of the sidewall insulator 10 within via 9, a second interconnect metal layer 12 is deposited. The second interconnect metal layer 12 is thereafter patterned and etched in a fashion similar to that employed for the first interconnect metal 5 to form a multiplicity of interconnecting Metal 2 lines. Importantly, the second interconnect metal layer 12 serves to fill the via 9 and thereby electrically connects the Metal 2 lines to the Metal 1 lines through the via 9. As can be seen in FIG. 1B, Metal 2 and Metal 1 are interconnected through the via 9 but are insulated from the ground plane 7 by sidewall insulator 10, which in cross-section view appears on each side of the second interconnect metal layer 12 extending through the via 9 and contacting the first interconnect metal layer 5 below. Conducting paths may be alternatively fabricated, including a "plug" process, wherein a conducting material is deposited to fill a via, and then separately depositing and patterning another conducting material for the signal and power paths. It should be noted that in all of the embodiments of the present invention, all openings such as via 9 may be filled during the subsequent interconnect layer deposition as described in conjunction with the embodiments of FIGS. 1A and 1B, or may be filled with the alternative plug process, depending upon device and process considerations.

Finally, an encapsulating dielectric passivation layer 13 is deposited over all layers for subsequent levels of interconnections or to guard against harmful external environments. The above described process for producing embedded ground planes having sidewall insulators permits ground planes to extend over substantially the entire surface of the substrate, and yet simplifies fabrication of such an embedded ground plane by eliminating two unneeded process steps used in prior art methodologies. Using a single photo-resist mask to define the upper and lower insulating dielectrics 6 and 8, as well as the via 9 within the ground plane 7 ensures that all levels will be self-aligned to via 9 in addition to being more efficiently fabricated. In the present invention, self-aligned dielectric layers 8 and 6 and ground plane layer 7 produce collinear edges, wherein the edge of each layer is precisely coincident with the edge of an adjoining layer in the triple layer sandwich 15. A significant and principal benefit of the self-aligned edges is that, in contrast to prior art multiple masking operations used in via fabrication, the present invention eliminates entirely shorting of the ground plane 7 to the second metal layer 12 deposited within via 9 due to misalignment of the ground plane 7 and dielectric layers 6 and 8 induced by separate photo-lithography masking operations. Overall fabrication yield is therefore enhanced.

Figure 2:
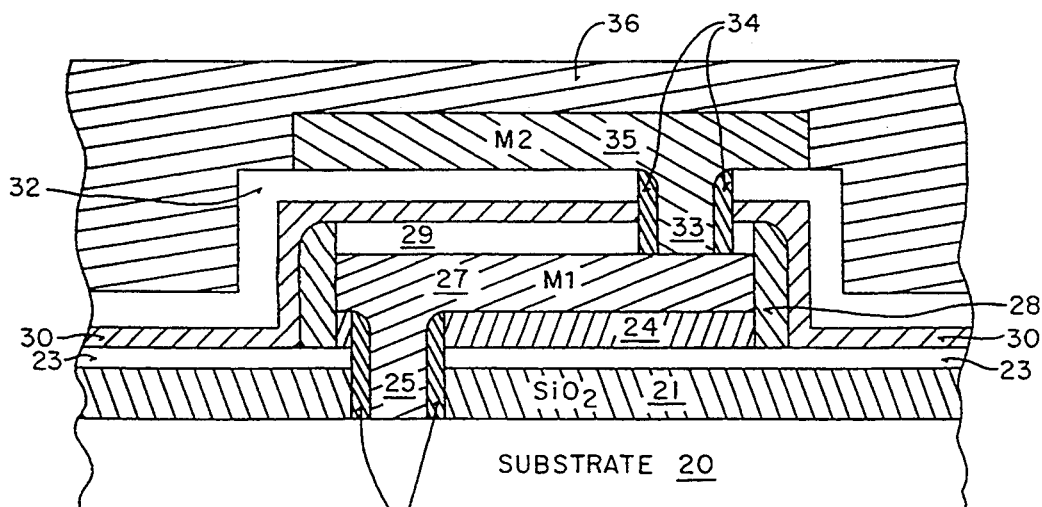
FIG. 2 illustrates a second alternative embodiment of the present invention, wherein multiple combinations of sidewall insulators are combined to form an encapsulating shield for an embedded conductor layer.

The embedded ground plane can also be fabricated within the insulating layer 3 or within the insulating layer 13 with accompanying sidewall insulators. Referring now to FIG. 2, a second alternative embodiment of the present invention is shown. The fabrication of a sidewall insulator is identical in the embodiment shown in FIG. 2 as in FIG. 1 discussed above, except that the fabrication steps are repeated in order to form duplicate or multiple pairs of sidewall insulators to entirely surround an embedded metallic conductor. The purpose of the multiple sidewall insulators in the second alternative embodiment illustrated in FIG. 2 is to provide in essence a "shield" to encapsulate critical signal pathways. In FIG. 2, a substrate containing non-metallic circuit definitions receives a first insulating dielectric layer 21, followed immediately by deposition of a first ground plane metal 23 and a second insulating dielectric layer 24. First and second dielectric layers 21 and 24, and first ground plane metal 23, together comprise a first triple layer sandwich layer. A first interconnecting via 25 is fabricated according to the process described in accordance with the first embodiment discussed above, wherein a photo-resist layer is applied and all three layers 21, 23, and 24 etched, and whereafter a first sidewall insulator 26 is formed on the sidewalls of the via 25. A first interconnecting metal layer 27 is next deposited, followed immediately by a third dielectric insulating layer 29. Dielectric layer 29 and interconnect metal 27 are subsequently patterned together and then etched using the same photo-resist layer with appropriate photo-lithography and etching operations to form Metal 1 lines which are to be shielded. Importantly, the reader should note that dielectric layers 24 and 29 and interconnect metal 27 form a second triple layer sandwich layer similar to the first triple layer sandwich described above, wherein the lateral edges of insulating dielectric layers 29 and interconnect metal 27 are collinear and coincident with each other.

Following definition of layers 24, 27, and 29, a second sidewall insulator 28 is formed on the lateral edges of interconnect metal 27, in a fashion identical to that described with respect to sidewall insulator 26 above. Thus, at this point in the processing, Metal 1 line formed of interconnect metal 27 is insulated from the ground plane below it and now has sidewall insulator 28 on each lateral side of it formed using an anisotropic etch step. Thereafter, a second ground plane metal 30 is deposited, followed immediately by a fourth dielectric insulating layer 32. Dielectric layers 29, 32, and ground plane metal 30 are subsequently photo-lithographically defined and etched in a manner similar to the previous definitions described, forming a third triple layer sandwich structure above the interconnect metal 27. Following the definition and etching of layers 29, 30, and 32, a third sidewall insulator 34 is created in the fashion identical to insulating sidewall structures 28 and 26. Specifically, a photo-resist mask is first applied above the fourth insulating dielectric layer 32 whereafter the photo-resist is exposed to define a second via 33 through layers 29, 30, and 32. After the photo-resist has been appropriately defined, the via 33 is opened with suitable etch processes for the insulating dielectric layers 29 and 32 and the second ground plane metal 30. Thereafter, the third LTO dielectric layer 34 is deposited, after which a blanket anisotropic etch removes all of the LTO except on the vertical walls of the previously formed via 33.

A second interconnect metal layer 35 is then deposited above the fourth insulating dielectric layer 32 and into the previously opened via 33. The second interconnect metal layer 35 is subsequently defined and etched to form Metal 2 lines for individual signal pathways. Finally, an encapsulating insulating dielectric 36 is deposited over the entire structure. As illustrated in FIG. 2, the multiple sidewall structures thus formed electrically insulate the Metal 1 lines from ground plane layers 23 and 30 forming the encapsulating shield as alluded to above. In particular, the first interconnect metal layer 27 is entirely surrounded by insulating dielectric layers 24, 26, 28, and 29. The added benefit of the second alternative embodiment is that environmentally sensitive metals or signal paths unusually sensitive to electromagnetic interference used for the first interconnect layer 27 may be essentially "hermetically sealed" within the aforesaid layers, thereby adding an additional margin of safety and insulation.

The insulating sidewalls as discussed above in connection with FIGS. 1B and 2 further possess the additional benefit that they are self-verifying. In both cases, because the sidewall insulator structures are deposited separately and are distinct from the laterally extending insulating dielectric layers, the vertically extending sidewall insulators may be visually verified using any of several known cross-sectional imaging techniques. In particular, the separately deposited insulating dielectric layers will be seen as distinct structures, permitting the manufacturer of components incorporating the embedded ground plane of the present invention to verify whether products manufactured by another employ either the process or the sidewall structure of the present invention.

Figure 3A:
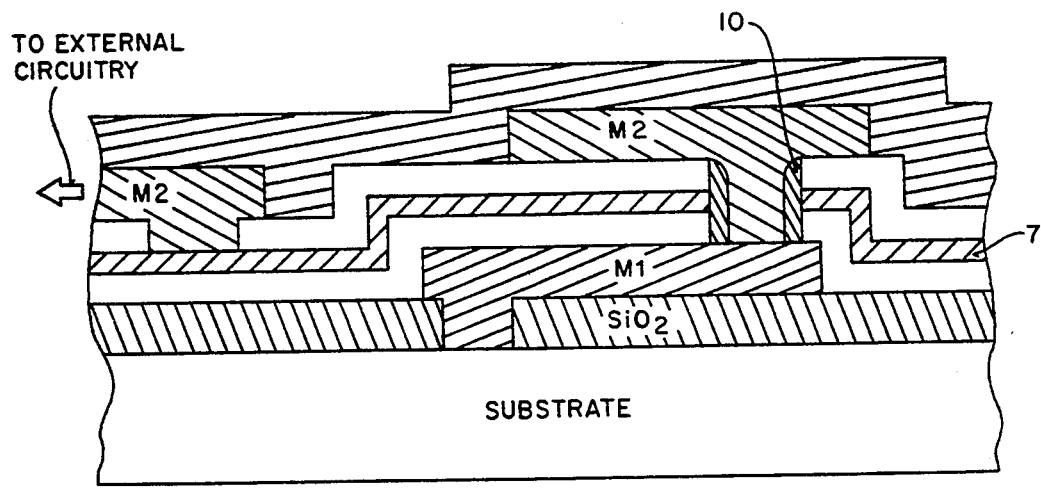
FIG. 3A illustrates a cross-sectional view of the present invention wherein contact metallization is made to the ground plane by Metal 2.
Figure 3B:
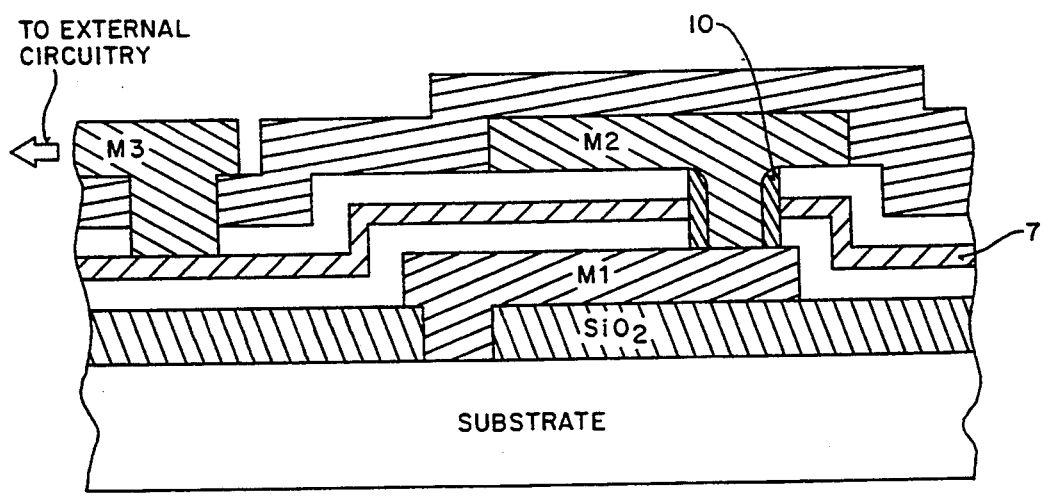
FIG. 3B illustrates a cross-sectional view of the present invention where contact metallization is made to the ground plane by Metal 3.

With brief reference to FIGS. 3A and 3B, alternative methods of making electrical contact with the ground plane of the first alternative embodiment illustrated in FIG. 1A are shown. However, such connections may not be necessary because of the large capacitance of the ground plane. In FIG. 3A, Metal 2 is shown to interconnect to Metal 1 lines through via 9 as well as provide contact metallization for external circuitry. An extra photo-lithographic step may be necessary to produce the Metal 2 contact metallization shown in FIG. 3A. In FIG. 3B, contact metallization to external circuitry is made by a separately deposited Metal 3 layer (M3), Metal 2 being reserved only for interconnecting to Metal 1 layers below.

Referring now to FIG. 4, generalized exemplary process flow specifications to fabricate embedded ground planes with insulating sidewall structures are shown. The process flow described in FIG. 4 is that employed to fabricate one sidewall insulator as shown in FIG. 1A above. Multiple sidewall insulator pairs forming a shielding structure as illustrated in FIG. 2 may be obtained by repeating the appropriate fabrication operations. Nominal dimensions for process specifications have been provided, but are intended for illustration purposes only, and are not intended as limits on the scope of the present invention. Further, it is anticipated that process materials other than those specifically described in FIG. 4 may be utilized to obtain the insulated ground plane structures of the present invention.

The foregoing has described two alternative embodiments of an embedded ground plane structure using sidewall insulators with an optimized processing methodology. The processing steps described used to produce the embedded ground plane structure reduce process complexity and associated costs and cycle time, as well as improve the fabrication yield due to the reduced processing required by the present invention. It is contemplated that changes and modifications may be made by one of ordinary skill in the art, to the materials and arrangements of elements of the present invention without departing from the spirit and scope of the invention.

Referring to FIGS. 5 and 6, a third preferred embodiment of the invention will now be described. The third preferred embodiment provides an alternative method for forming the sidewall insulator structures set forth above in which an etch-stop/masking layer is additionally employed to facilitate formation of openings and to facilitate the anisotropic etch of the sidewall insulator dielectric. Steps of the alternative method using the etch-stop/masking layer are set forth in FIG. 6 with FIG. 5 providing cross-sectional illustrations of an exemplary ground plane structure at various stages during the formation method.

Figure 5A:
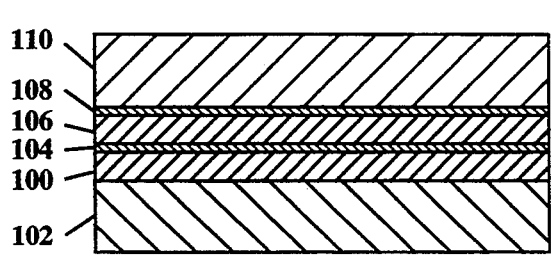
FIGS. 5A–5H illustrate a sequence of cross-sectional views of the fabrication of an embedded ground plane with insulating sidewalls, wherein an etch-stop/masking layer is used to facilitate formation of a opening in which a metal contact is deposited.

Referring first to FIG. 5A, a first silicon dioxide dielectric layer 100 is deposited onto a substrate 102. Substrate 102 could be, for example, a semiconductor wafer, having, for example, device regions, such as diffusion regions, other structures such as gates, local interconnects, metal layers, or other device structures or layers. Hence, the term substrate as it is used herein generally refers to any underlying layer, which may, for example, be a underlying metal layer or an underlying silicon layer. Thus, substrate 102 may include completed underlying circuit structures, not illustrated in the figures.

Silicon dioxide layer 100 is preferably deposited by conventional techniques to a depth of 3,000 angstroms. An electrically conducting ground plane layer 104 is deposited on dielectric 100. Ground plane layer 104 is preferably formed of tungsten or aluminum sputter deposited to a depth of about 1,000 angstroms although any good conductor can be used. A second silicon dioxide dielectric layer 106 is deposited, also, by conventional techniques, onto ground plane layer 104. Thus far, the deposition method and resulting structure are similar to those set forth above. However, rather than immediately proceeding to etch an opening into the layered structure, an etch-stop/masking layer 108 is deposited onto dielectric 106. Etch-stop/masking layer 108 is a very thin layer of a material, preferably silicon nitride or silicon, or alternatively another material such as aluminum or silicon dioxide for example, resistant to the etch process used to etch layer 100. The etch-stop/masking layer 108 is deposited by conventional techniques to a desired thickness. A photo-resist layer 110 is deposited onto etch-stop/masking layer 108 and defined to allow formation of part of an opening 112, illustrated in FIG. 5B.

Figure 5B:
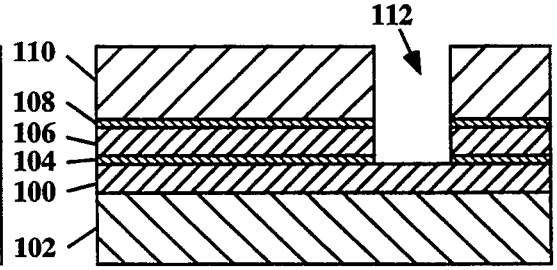

Opening 112 of FIG. 5B is etched through etch-stop/masking layer 108, silicon dioxide layer 106, ground plane layer 104 and silicon dioxide layer 100 to expose a portion of substrate 102. The etching of opening 112 employs a number of sequential steps which successively etch the various layers. In particular, the formation of the via initially requires hardening of the photoresist layer followed by the etching of the etch-stop/masking layer 108 to expose the dielectric layer 106. Next, a contact oxide etch is employed to expose ground plane 104, followed by a ground plane metal etch which exposes the lower silicon dioxide layer 100. The stage at which the lower silicon dioxide layer is exposed is illustrated in FIG. 5B. As with the embodiments above, the single photo-resist layer permits successive etch processes to sequentially remove layers 108, 106 and 104 where not masked by photo-resist 110. As presently preferred, three separate etch processes are used to etch, in order, layers 108, 106 and 104. However, it is anticipated that in certain circumstances, all three layers can be etched simultaneously in a suitable etch processes.

Figure 5C:
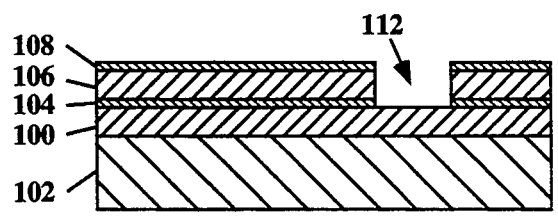
Figure 5D:
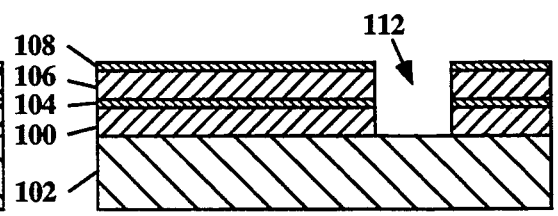

Once the etch reaches the stage illustrated in FIG. 5B, where the lowermost silicon dioxide layer 100 is exposed, photo-resist layer 110 can then be completely removed, yielding the structure of FIG. 5C. A final etching of silicon dioxide layer 100 to expose a portion of substrate 102 is illustrated in FIG. 5D. Etch-stop/masking layer 108 facilitates the multi-step etching process used to form opening 112 by preventing the etching processes from unduly degrading top-most silicon dioxide layer 106. In particular, it has been found that during etching of layers 100, 104 and 106 without an etch-stop/masking layer, a greater portion of layer 106 is etched than layer 100, resulting in a step-like structure. This appears to occur because the photoresist is widened and degraded during etching of ground plane layer 104. Also the photo resist becomes thin after the ground-plane metal etch. Thus, during subsequent etching of lower dielectric layer 100 the widened aperture in the photo-resist causes additional etching of the top dielectric layer if the etch-stop/masking layer 108 were absent. Hence, a greater width of the top dielectric would be etched than the lower dielectric because the metal layer 104 acts like a mask, resulting in non-vertical walls. The presence of the etch-stop/masking layer substantially prevents the widened photo-resist opening from causing further etching of the top dielectric 106 during subsequent etching of lower dielectric 100. The verticality of the sidewalls of opening 112 is improved, and sharp corners are maintained during etching.

Figure 5E:
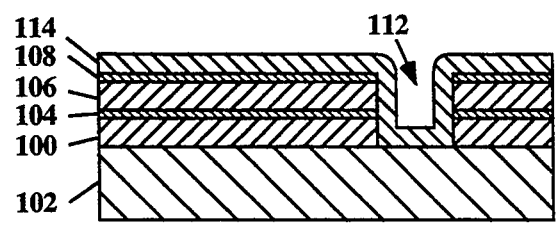

As illustrated in FIG. 5E, a third layer 114, which may also be silicon dioxide, is deposited onto etch-stop/masking layer 108 and within opening 112. Third layer 114 is deposited via "blanket" deposition which covers all interior surfaces of opening 112. Preferably, layer 114 is deposited to a depth of 3,000 angstroms.

Figure 5F:
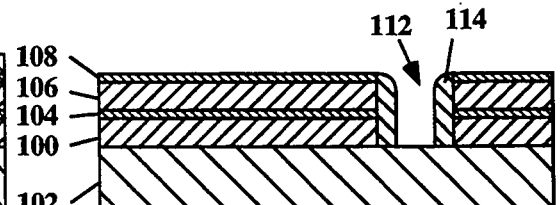
Figure 5G:
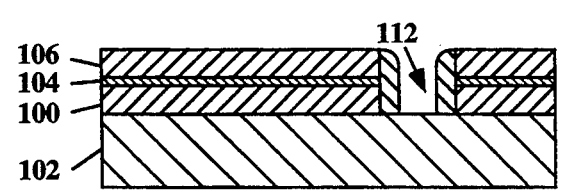
Figure 5H:
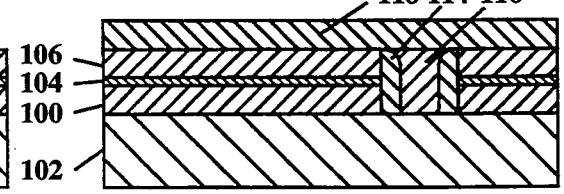

As illustrated in FIG. 5F, an anisotropic etch is performed to remove horizontal portions of layer 114, thereby exposing etch-stop/masking layer 108 and a portion of substrate 102. The anisotropic etch proceeds according to the methods described above. However, the presence of etch-stop/masking layer 108 helps ensure that dielectric 106 is not damaged, degraded, or etched by an amount sufficient to expose ground plane 104 at any point across the complete substrate. The structure following the anisotropic etch is illustrated in FIG. 5F. Next, as shown in FIG. 5G, the etch-stop/masking layer is removed thereby yielding an embedded ground plane structure similar to those set forth in the embodiments above. Finally, as shown in FIG. 5H, a conductive material 116 is deposited within opening 112 for interconnecting regions within substrate 102 to electrical inputs or outputs (not shown). An interconnecting conductor 118 may be deposited over the entire structure to connect the conductive material 116 to upper levels. An overlying insulating dielectric (not shown) may also be deposited.

In the foregoing, etch-stop layer 108 is removed. However, for certain applications, etch-stop layer 108 may be retained. For example, if etch-stop layer 108 is formed of an insulating material, it may be desirable to retain the etch-stop layer. Also, the foregoing generally refers to the formation of an opening. Depending upon particular applications, the opening may form a via. Finally, with regard to the foregoing description of FIG. 5, it should be noted that etch-stop layer 108 may also be used to assist in an etch-back of conductive material 116.

Ground plane layer 104 may be formed of a variety of materials. However, sputtered tungsten is preferred. The use of sputtered tungsten allows for top and bottom dielectric 106 and 100 and ground plane layer 104 to be etched in one etching step using a single set of chemicals. Silicon nitride is preferred as the material for the etch-stop/masking layer since it is different from $SiO_2$ although other suitable materials such as silicon, aluminum or tungsten would work.

The deposition steps, described above, are set forth in FIG. 6. The deposition method illustrated in FIG. 6 provides a method of forming the sidewall insulated ground plane structures, described above, which is particularly directed to forming and maintaining sharp vertical sidewalls and for ensuring that the sidewall insulator adequately covers the edge of the ground plane to prevent electrical connection with the metal contact deposited within the opening. The method of FIG. 6 is described with respect to specific materials ultimately resulting in formation of an interconnecting via metal. Although well suited to form the structure of FIG. 5, the deposition method set forth in FIG. 6 may be applied to produce other structures as well. Further, those skilled in the art will appreciate that the various compositions and dimensions described above and illustrated in FIGS. 5 and 6 are exemplary parameters which may be varied as needed. Other suitable dielectric substances may be employed and other suitable electrically conducting substances may be employed. For example, the dielectric may be formed with silicon nitride rather than silicon dioxide and the ground plane may be formed from tungsten rather than aluminum. Furthermore, the method need not be employed solely to isolate a ground plane within the structure, but may be employed to isolate other layers as well.

With reference to FIGS. 7 and 8, a fourth preferred embodiment of the invention will now be described. This fourth embodiment of the invention provides an alternative structure having an insulated ground plane. A method for forming the alternative structure is also provided. The structure is illustrated in FIG. 7 at several stages of deposition. The method of formation of the structure is illustrated in FIG. 8.

Figure 7A:
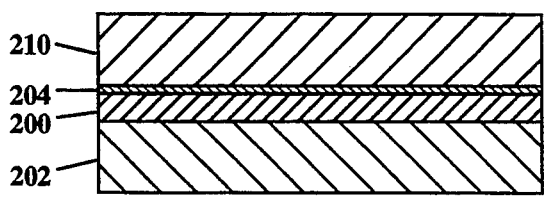
FIGS. 7A–7F illustrate sequential cross-sectional views of the fabrication of an embedded ground plane with insulating sidewalls, wherein one masking step rather than two is needed and a separate sidewall insulator layer need not be deposited.

Referring first to FIG. 7A, an initial ground plane structure is formed by depositing a first dielectric silicon dioxide layer 200 on a substrate 202. Next, an electrically conducting ground plane layer 204, preferably formed of aluminum, is deposited onto dielectric 200. Then, an upper silicon dioxide dielectric layer 206 is deposited onto ground plane layer 204. The initial structure is completed by depositing a patterned photo-resist layer 210 onto the ground plane 204.

Figure 7B:
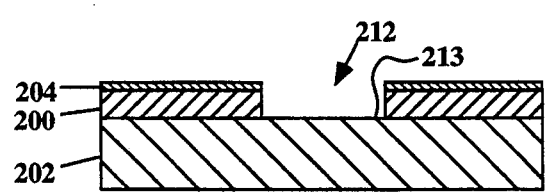
Figure 7C:
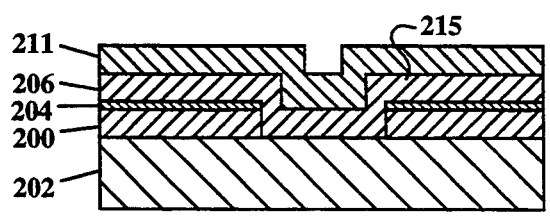
Figure 7D:
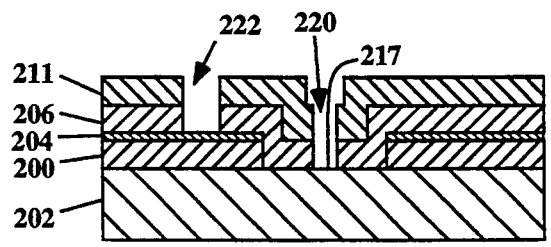

As illustrated in FIG. 7B, a first or primary opening 212 is formed within the multi-layer structure, using conventional photo-lithography and etching techniques. Opening 212 is formed through ground plane layer 204 and lower dielectric 200 to expose a portion 213 of substrate 202. Once opening 212 is formed, photo-resist layer 210 is removed, yielding the structure shown in FIG. 7B.

After opening 212 is formed, a second dielectric layer 206 is deposited onto ground plane 204 and into opening 212. Second dielectric 206 substantially fills the interior of opening 212 forming vertical sidewalls 215 and horizontal bottom sidewall covering portion 213 of substrate 202. A second photo-resist layer 211 is deposited onto second dielectric 206. As can be seen from FIG. 7C, photo-resist 211 matches the multi-leveled structure of dielectric 206. Before depositing the photoresist, chemical-mechanical polishing may be employed to planarize the dielectric layer 206 by etching back a portion of dielectric layer 206.

Figure 7E:
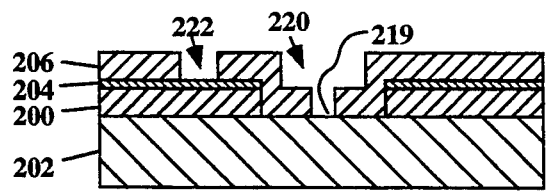

Conventional photo-lithography and etching processes are employed to form a second opening 220 and a third opening 222. Second opening 220 is formed through dielectric 206 to expose a central area to 217 of portion 213 of substrate 202. Thus, second opening 220 is formed within a space previously defining first opening 212. However, second opening 220 is not as wide as first opening 212. Rather, opening 220 is offset from vertical sidewalls 215 of dielectric 206. Third opening 222 is formed through photo-resist 211 and second dielectric 206 and to expose a portion of ground plane 204. Thus, unlike opening 220 which exposes a portion of substrate 217, opening 222 exposes a portion of ground plane 204 for connecting to ground or power. Thereafter, as shown in FIG. 7E, photo-resist 211 is removed exposing dielectric layer 206 while leaving the second and third openings 220 and 222 respectively.

By forming second opening 220 with a width substantially narrower than original opening 212, vertical portions 215 of second dielectric 206 form sidewall insulators covering edges of ground plane 204. As shown, the resulting cross-sectional configuration of second dielectric layer 206 has a stepped structure surrounding opening 222. However, if desired, opening 220 can be formed to have a greater width eliminating bottom horizontal portions of the second dielectric, but leaving the vertical sidewall portions 215.

Figure 7F:
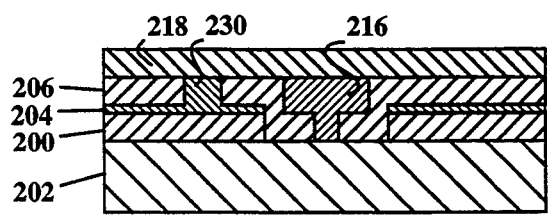

As shown in FIG. 7F, conductive material 216 is formed within opening 220 and conductive material 230 is formed within opening 222. An interconnecting layer 218 is deposited over the entire structure. An insulating layer (not shown) is preferably deposited over interconnecting layer 218. Conductive material 216 provides an electrical connection between circuits of substrate 202 and input/output lines (not shown). Conductive material 230 provides a connection to ground plane 204 to an external contact (not shown). Conductive material 230 is preferably provided to facilitate the grounding of ground plane 204 by allowing a direct electrical connection to a ground (not shown). The formation and use of opening 222 and conductive material 230 is entirely separate and distinct from opening 220 and conductive material 216.

A suitable method for forming the structure illustrated in FIG. 7F is provided in FIG. 8. The method illustrated in FIG. 8 is specifically drawn to the formation of vias using particular materials. As can be appreciated, the method steps of FIG. 8 can be generalized for alternative materials and for the formation of alternative interconnecting structures. The structure of FIG. 7F may be formed from alternative methods. Furthermore, the processes illustrated in FIG. 8 may be utilized to form structures other than that shown in FIG. 7.

The method and apparatus illustrated in FIG. 7 and 8 provide sidewall insulators for isolating embedded ground planes which do not require the use of anisotropic etch, as described above in preceding embodiments. Thus, this embodiment of the invention achieves ground plane isolation without requiring the deposition of a third dielectric or requiring the anisotropic etch of a third dielectric. Also, an additional via may be etched directly to the ground plane simultaneously with the etch of the second dielectric for the vias to the underlying substrate. As with the preceding embodiments, a variety of compounds may be employed and a variety of deposition dimensions may be achieved, consistent with the principles of the invention.

Referring to FIGS. 9 and 10, a fifth preferred embodiment of the invention will be described. The deposition method and resulting structure illustrated in FIGS. 9 and 10 is similar to that of FIGS. 7 and 8 and only pertinent differences will be described in detail. In FIG. 9 elements are represented by reference numerals used in FIG. 7, but incremented by 100. FIGS. 9A–9C illustrate the deposition of first and second dielectrics 300 and 306, a ground plane 304, and a photo-resist 311 onto a substrate 302. These deposition steps may be identical to those of FIG. 7A–7C. However, as illustrated in FIG. 9D, photo-resist 311 is patterned differently that than of photo-resist 211 of FIG. 7 to provide a larger opening 330. More specifically, photo-resist 311 is patterned to provide a opening which not only exposes a portion of substrate 302 but also exposes a portion of ground plane 304. Hence, only one side of ground plane 304 is isolated by a dielectric sidewall. If desired, opening 320 can be etched in a manner such that neither side of ground plane 304 is isolated by a dielectric sidewall. The structure illustrated in FIG. 9 is shown in cross-section and it should be understood that the actual three dimensional structure may include a via having a substantially circular horizontal cross-section. Photo-resist 311 may be patterned to expose a semi-circular portion of ground plane 304 or may be patterned to expose a narrower or wider angular portion.

Figure 9A:
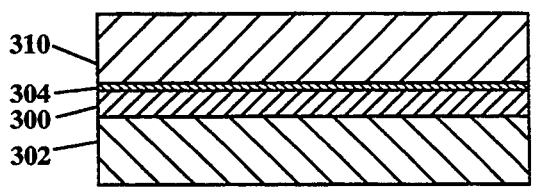
FIGS. 9A–9E illustrate sequential cross-sectional views of the fabrication of an embedded ground plane having a metal contact to the ground plane.
Figure 9B:
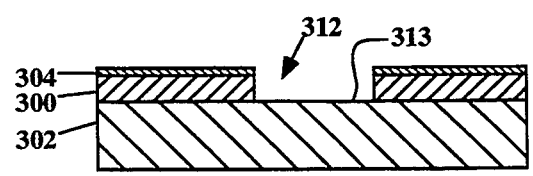
Figure 9C:
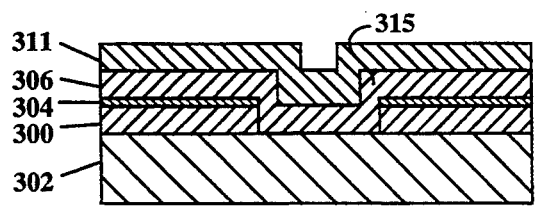
Figure 9D:
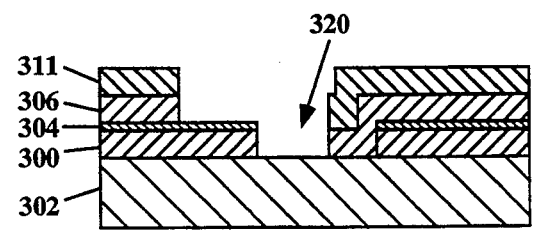
Figure 9E:
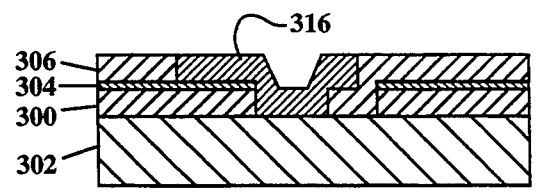

As illustrated in FIG. 9E, a conductive material 316 is deposited within opening 330 which abuts ground plane 304. Conductive material 316 provides a direct electrical connection between substrate 302 and ground plane 304. It should be understood that conductive material 316 may extend to connect other contacts or circuits (not shown).

FIG. 10 illustrates a deposition method which may be employed to form the structure illustrated in FIG. 9 or to form other suitable structures as well.

Referring to FIG. 11, another embodiment of the invention will be described. The deposition method and resulting structure illustrated in FIG. 11 is similar to that of FIGS. 7 and 8 and only pertinent differences will be described in detail. In FIG. 11, elements are represented by reference numerals used in FIG. 7, but incremented by 200. FIG. 11A illustrates the deposition of dielectric layer 400, a ground plane 404, and a photo-resist layer 410 having opening 411 onto a substrate 402. FIG. 11B illustrates the structure of FIG. 11A after sequential etches remove the portion of ground plane 404, and dielectric layer 400 in the region exposed by opening 411, and after removal of photo-resist layer 410. FIG. 11C illustrates the deposition of dielectric layer 406. The processing shown in FIGS. 11A–11C may be identical to that shown in FIGS. 7A–7C, except that opening 412 is formed with considerably greater width than opening 212 of FIG. 7. With the additional width of opening 412, a plurality of secondary openings 420 may be formed where the embodiment of FIG. 7 allowed only a single secondary opening 220. In FIG. 11D, exemplary individual secondary openings are $420_1$, $420_2$ and $420_3$. As can be appreciated, depending upon the width of opening 412 and the precision with which the secondary openings may be formed, a much greater number of secondary openings may be fabricated. Furthermore, as with the embodiment shown in FIGS. 9 and 10, at least some of the secondary openings may be formed directly adjacent to ground plane 404, rather than being off-set from ground plane 404 by a sidewall layer. Additionally, vias similar to openings 420 can be formed in dielectric layer 406 over ground plane 404 simultaneous with the formation of opening 420 to provide for connection to ground plane 404.

Figure 11A:
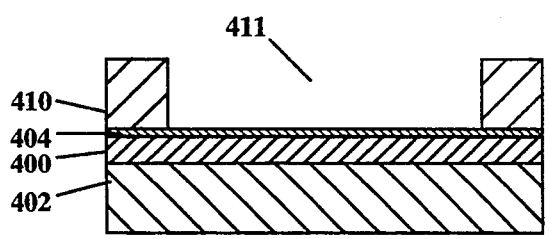
FIGS. 11A–11E illustrate sequential cross-sectional views of the fabrication of a selective area embedded ground plane.
Figure 11B:
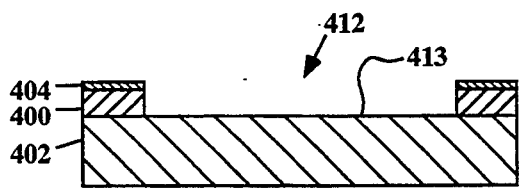
Figure 11C:
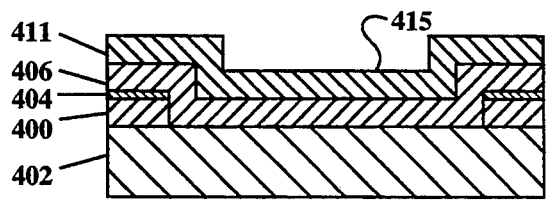
Figure 11D:
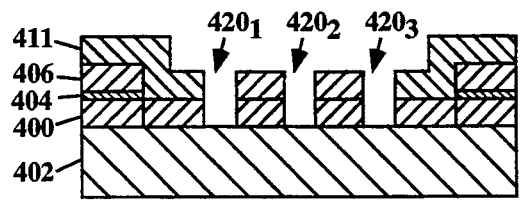
Figure 11E:
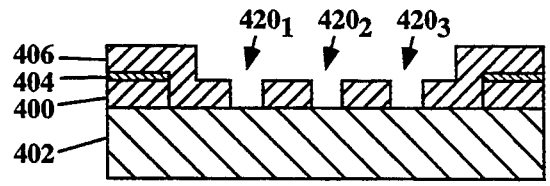

After etching the plurality of secondary openings $420_1$, $420_2$ and $420_3$, masking layer 411 is removed yielding the structure of FIG. 11E. Although not shown, individual plugs of conductive material may be provided within the various secondary openings $420_1$, $420_2$ and $420_3$ to provide interconnection with portions of substrate 402. An overlying interconnecting layer (not shown) may be deposited over the entire structure and an insulating layer deposited upon the interconnecting metal layer (not shown).

Figure 12:
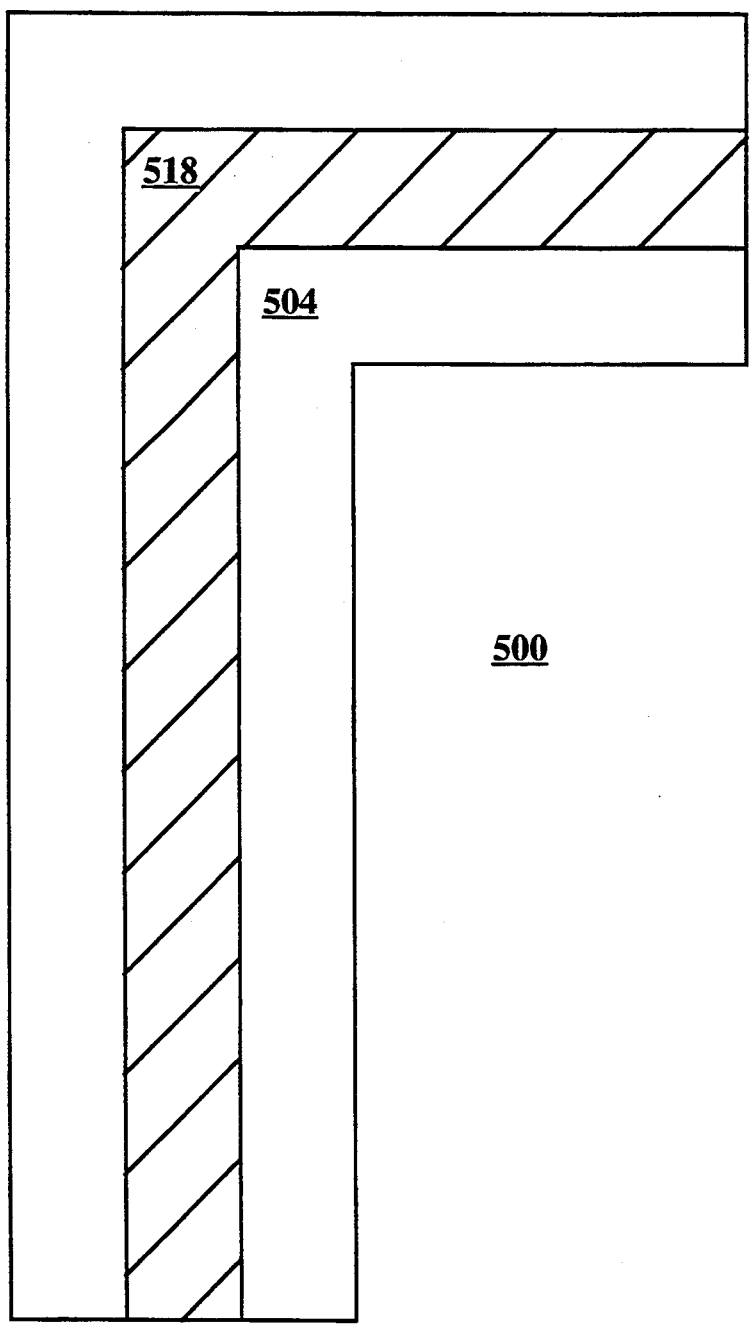
FIG. 12 illustrates a top view of an embedded ground plane fabricated according to the embodiment of FIG. 11.

The provision of a plurality of secondary openings is particularly desirable in areas of a chip where there is considerable complexity of interconnections. By providing a relatively large initial opening 412, a large number of contacts may be fabricated conveniently. The provision of the initial broad opening 412 is also advantageously employed in an area of the chip where no ground plane is desired. If a plurality of separate openings are fabricated using the method of FIG. 7 and 8, small ground plane sections would lie between the various secondary openings. Such may not be either necessary or desirable because it would limit the density of interconnections. The technique of FIG. 11 allows for formation of a plurality of openings in an area having no ground plane. Furthermore, for many applications, a ground plane is only required in an area of the chip where high-speed signals are transmitted. Accordingly, a ground plane need not be required throughout large portions of the chip. The technique of FIG. 11 thus allows for the fabrication of complex interconnections in area of the chip which do not require a ground plane while still retaining the ground plane in those areas of the chip which may require the ground plane. In particular the ground plane may be retained adjacent to input power contacts and ground contacts. It should be noted that the selective placement of the ground plane shown and described in conjunction with FIG. 11 is not limited to an opening such as opening 412 within an otherwise continuous ground plane layer. Rather, the ground plane of the present invention can selectively be placed in one or more portions of a substrate, and may have any desired shape and may be placed in any one or more locations as needed. In addition to choosing areas of a chip for ground planes, individual interconnections, for example high-frequency clock lines, can selectively be chosen to have a ground plane above and/or below them. With this selective-area ground plane, the designer has another option for controlling the impedance. For example, when a driver has a high impedance, then a transmission line that also has a high impedance is desirable to minimize reflectance and ringing, so that it would not be desirable to have a ground plane near such a line. This can be achieved by removing the ground plane or reducing it to a narrow ground plane or a set of parallel wires. FIG. 12 shows a top view of a portion of a substrate 500 with a portion of interconnect 518 thereon. Underlying interconnect 518 is ground plane 504, which can be any of the ground planes of the present invention. Ground plane 504 is insulated from interconnect 518 by an insulative layer such as those described previously which is not shown in FIG. 12. As shown, ground plane 504 covers only an L-shaped portion of the substrate, and other areas where a ground plane is not needed or not desired, do not have the imbedded ground plane structure of the present invention. Additionally, it will be understood that many other areas of the substrate may have similar portions of ground plane 504, which as mentioned above may have any shape. All such structures can be formed simultaneously in accordance with the principles discussed with respect to FIG. 11. Provision may be made for each such portion of ground plane 504 to be coupled to ground using any of the previously described methods. Alternatively, if the capacitance of ground plane 504 is sufficiently large, connection to ground may not be necessary. Where there are many such disconnected ground planes, some may be connected to ground, while others are not, as needed. It will be appreciated that any of the ground planes of the present invention including the selective area ground planes, can be placed either above, below, or both above and below an individual interconnection or level of interconnection. Finally, it will be appreciated that various methods of fabrication of the ground planes and methods of interconnection shown in one embodiment may be used in other embodiments. For example, the selective area ground plane may be fabricated using an etch-stop/masking layer described in relation to FIG. 5.

Furthermore, the ground plane may be interconnected with other metal layers to form decoupling capacitors in the vicinity of input power and ground contacts. This would be best done by making dielectric layer 400 of FIG. 11 thin and using a material with a high dielectric constant such that it couples capacitively to the underlying power level or capacitor plate. A description of the techniques for fabricating a capacitor structure by employing two or more ground planes and by positioning a ground plane adjacent to power and/or ground lines is further described in the copending application identified above.

What has been described are several integrated circuit ground plane structures and methods for forming such structures, in which one or more sidewall insulators are provided for isolating at least a portion of a ground plane from a metal contact extending through a via to a substrate below the ground plane. The first and second embodiments employ an anisotropic etch of a dielectric layer formed within a via to expose a substrate at the bottom of the via while retaining sidewall portions of the dielectric as sidewall insulators. The third embodiment provides an alternative formation method in which an etch-stop/masking layer is provided prior to formation of the via to facilitate the via formation and to ensure substantially vertical via sidewalls. The fourth embodiment provides an alternative formation method which does not require a third dielectric layer and anisotropic etch. The fifth embodiment provides yet another alternative formation method, which also does not require an anisotropic etch, but which provides a butting contact between the ground plane and an underlying substrate. A further embodiment describes a method for incorporating ground planes or decoupling capacitors selectively in certain areas of a chip and not in other areas. Those skilled in the art will appreciate that the principles of the invention set forth above may be implemented in a number of ways to yield a variety of structures and the scope of the invention is not limited by the preferred embodiments described herein.

I claim:

1. A multi-layer structure comprising:
   a substrate having a top surface having first and second portions;
   a first dielectric layer, an electrically conducting layer, and a second dielectric layer, formed in parallel on said first portion of said substrate leaving an aperture having substantially vertical sidewalls around said second portion of said substrate; and
   an insulating layer extending along said substantially vertical sidewalls of said aperture from said substrate to a top surface of said second dielectric.

2. The multi-layer structure of claim 1 further comprising:
   a conducting material filling said aperture and extending from said second portion of said substrate to said top surface of said second dielectric.

3. A multi-layer structure comprising:
   a substrate having a top surface having first and second portions;
   a first dielectric and a conducting layer formed in parallel on said second portion of said substrate;
   a second dielectric formed on a top portion of said conducting layer and having substantially vertical sidewalls adjacent to said first portion of said top surface of said substrate; and
   a second dielectric formed on a top portion of said conducting layer, said second dielectric extending along vertical side edges of said first dielectric and said electrically conducting layer to said first portion of said substrate and extending along a portion of said second portion of said substrate, with said second dielectric having a substantially L-shaped cross section taken perpendicular to said top surface of said substrate.

4. The multi-layer structure of claim 3 further comprising:
   a conducting material formed on said second portion of said top surface of said substrate, said conducting material extending between a pair of opposing L-shaped portions of said second dielectric.

5. The multi-layer structure of claim 4 further comprising a conducting layer formed on a top surface of said second dielectric and on a top surface of said conducting material.

6. The multi-layer structure of claim 5 further comprising a metal interconnect connecting a portion of said upper conducting layer to said conducting layer.

7. A multi-layer structure comprising:
   a substrate having a top surface with first and second portions;

a first dielectric and a conducting layer formed in parallel on said second portion of said substrate and having substantially vertical side edges adjacent to said first portion of said substrate;

a second dielectric layer having a first portion extending along a first portion of a top surface of said conducting layer, said first portion of said second dielectric extending along said substantially vertical side edges of said conducting layer and said first dielectric, and extending along a portion of said second portion of said substrate;

wherein said second dielectric has a second portion extending along a second portion of a top surface of said conducting layer to a position offset from a side edge of said conducting layer thereby exposing a portion of said conducting layer; and a conducting material formed on said second portion of said substrate between said vertical portion of said first portion of said second dielectric and a side edge of said second portion of said second dielectric, said conducting material contacting said second portion of said conducting material.

8. A multi-layer structure comprising:

a substrate having a top surface with first and second portions;

a first dielectric layer and a conducting layer formed in parallel on said first portion of said top surface of said substrate; and a second dielectric layer formed along a top surface of said conducting layer, said second dielectric extending along said vertical sidewalls of said first dielectric and said conducting layer to said second portion of said top surface of said substrate, said second dielectric layer having portions formed on said second portion of said top surface of said substrate but offset from said sidewalls of said first dielectric layer and said conducting layer.

9. A multi-layer structure comprising:

a substrate;

a ground plane coveting a substantially L-shaped portion of a top surface of said substrate; and an interconnect covering a substantially L-shaped portion of a top surface of said ground plane, said interconnect being offset from opposing side edges of said ground plane.

* * * * *

UNITED STATES PATENT AND TRADEMARK OFFICE
CERTIFICATE OF CORRECTION

PATENT NO. : 5,414,221
DATED : May 9, 1995
INVENTOR(S) : Gardner

It is certified that error appears in the above-indentified patent and that said Letters Patent is hereby corrected as shown below:

In column 20, at line 17, delete "coveting" and substitute
   --covering--.

Signed and Sealed this

Seventh Day of January, 1997

Attest:

BRUCE LEHMAN

Attesting Officer     *Commissioner of Patents and Trademarks*

UNITED STATES PATENT AND TRADEMARK OFFICE
CERTIFICATE OF CORRECTION

PATENT NO. : 5,414,221
DATED : May 9, 1995
INVENTOR(S) : Donald S. Gardner

It is certified that error appears in the above-identified patent and that said Letters Patent is hereby corrected as shown below:

Column 18,
In claim 3, at line 10, please delete "a second dielectric" and insert --said second dielectric-- therein.

Signed and Sealed this

Sixteenth Day of June, 1998

Attest:

BRUCE LEHMAN

Attesting Officer     Commissioner of Patents and Trademarks